United States Patent

Pestie et al.

[15] 3,635,772

[45] Jan. 18, 1972

[54] METHOD OF MANUFACTURING SEMICONDUCTOR COMPONENTS

[72] Inventors: Jean-Pierre Pestie, Orsay; Jean Belmas, Massy, both of France

[73] Assignee: Compagnie Generale D'Electricite, Paris, France

[22] Filed: Apr. 10, 1969

[21] Appl. No.: 815,140

[30] Foreign Application Priority Data

May 8, 1968 France ....................151075
Apr. 10, 1968 France ....................147642

[52] U.S. Cl. ..........148/187, 317/235, 317/40.1 X
[51] Int. Cl. ..........H01l 7/44
[58] Field of Search..........148/187

[56] References Cited

UNITED STATES PATENTS 3,342,650 9/1967 Seki et al. ..........148/187

*Primary Examiner*—L. Dewayne Rutledge
*Assistant Examiner*—J. Davis
*Attorney*—Sughrue, Rothwell, Mion, Zinn and Macpeak

[57] ABSTRACT

With a view to carrying out successive treatments on the semiconductor component, the insulating layer of the said component is removed during a preliminary litho-engraving operation on the parts to be opened up later. The procedure can be applied to great advantage to plane structure high-frequency components in which the active base is prolonged by a peripheral part having an increased concentration of impurities, on which electrical connection is easier.

1 Claims, 11 Drawing Figures

METHOD OF MANUFACTURING SEMICONDUCTOR COMPONENTS

BACKGROUND OF THE INVENTION

1. Field of the Invention

The invention relates to a method of manufacturing semiconductor components having a number of different types of conductivity, and especially components of this type, of which one face is to undergo successive treatments in regions whose relative positions are to be precisely defined.

2. Description of the Prior Art

The great majority of such components are of the so-called "planar" structure, which have been widely marketed for a number of years. The technological methods employed in their production have become conventional. However, these technological methods are subject to a limitation in the production of high-frequency transistors. This limitation is related to the difficulty of lowering the thickness of the base below a few tenths of a micron. Methods differing from the conventional methods have been proposed for further lowering this thickness.

The present inventors have filed, on Mar. 7, 1968, French Pat. application No. pv 142,847, for "METHOD OF MANUFACTURING SEMICONDUCTOR DEVICES," which describes a method of manufacturing a transistor whereby an emitter is first created in the semiconductor material, which is required to perform the function of the collector, and thereafter forming the base by a diffusion treatment, in the course of which the diffusing impurity, which is introduced from a surface encompassing and extending beyond the surface of the emitter, penetrates on the nearer side thereof to a predetermined depth in order to form the base-collector junction of the transistor.

It is possible by applying this method to the manufacture of transistors of planar structure to lower the thickness of the base to beyond the aforesaid limit. The depth of the collector-base junction is thereby effectively controlled, provided that two impurities are introduced, the distribution coefficients thereof in the semiconductor under consideration being sufficiently different from one another, the impurity of lower coefficient being introduced first. However, this method gives rise to difficulties in the production of planar transistors of very small dimensions. It is known that the latter are produced with the aid of insulating oxide layers formed with apertures to permit the application of a diffusion treatment, for example, to a surface limited to these apertures. It is necessary to form such an aperture, i.e., to expose part of the surface of the semiconductor, in order to provide the connecting members for the component. If the latter is, for example, a transistor, two zones of the surface of the semiconductor must be exposed in order that electrical contacts may be made with the emitter and with the base. The aforesaid difficulty arises in the exposure of the contact-making zone on an emitter which is to have a minimum surface area, as is the case with transistors which are to operate at very high frequencies. The operations of conventional methods on the one hand, and those described in the aforesaid patent application on the other hand, result in different situations at the instant when the contact-making is to be made on the emitter.

The comparison is illustrated in FIGS. 1*a* and 2*a*.

FIG. 1*a* is a sectional view of a transistor, produced by the conventional method, in the phase of its manufacture following the last diffusion and preceding the exposure of the contact zone on the emitter.

FIG. 2*a* is a sectional view of a transistor, produced by the method described in the aforesaid patent application, at the same instant of its manufacture as in FIG. 1*a*, i.e., after the last diffusion and before the exposure of the emitter contact zone.

In these figures, the oxide thicknesses are greatly exaggerated in order to clearly show the various additions and removal of material, the dimensions given to the emitter and to the base being only symbolic.

In FIG. 1*a*, the semiconductor, for example silicon, is denoted by 1 and the oxide layer by 2. In FIG. 2*a*, the semiconductor is denoted by 21 and the oxide layer by 22.

In the conventional process, the oxide layer is formed of superimposed partial layers. Thus, it comprises thick portions such as 2′ in FIG. 1*a*, which cover the surface part of the collector, portions thinner than the preceding ones, such as 2″, which cover the zone flush with the base, and finally a portion 2‴ of very small thickness which covers the emitter surface. The thick portion 2′ corresponds to an initial layer enriched by two oxidation additions, the first of which is produced by the first diffusion and the second by the second diffusion; layer 2″ corresponds to the two oxidation additions produced by the first and second diffusion operations. The layer 2‴ corresponds to the oxidation due to the third diffusion only, and it is therefore a very fine oxide layer.

In the procedure described in the aforesaid application, in the course of which the emitter is made first, it is necessary, after this first diffusion, to remove the oxide covering the emitter and to form in the thick layer 22′ of FIG. 2*a* a window having the dimensions of the base. This window is covered in the course of the diffusion of the base by a layer 22″ of oxide resulting from this latter diffusion operation. It is this layer 22″ which covers, without distinction, the base and the emitter, as shown in FIG. 2*a*.

In the case of the conventional procedure, since the portion 2‴ of the layer of FIG. 1*a* has the minimum thickness and since its delimitation is suitable for locating the contact-making zone while protecting the base-emitter junction level, a simple washing called "emitter washing," consisting of a light etching of the oxide, so as to completely eliminate the thickness of the film 2‴, is sufficient to expose the contact-making zone on the emitter.

FIG. 1*b* shows the result of the "emitter washing" by which the emitter contact-making zone 3 of width (or diameter) "*d*" has been exposed.

It is not possible to adopt the same procedure if the emitter is made first. For making contacts, it is necessary to open in the layer 22′ of FIG. 2*a* two windows, 23 and 24, the first in the emitter and the second in the base, so as to retain the protection of the emitter-base junction level, as indicated in FIG. 2*b*.

Such apertures are usually formed by a photolithogravure process followed by etching of the oxide along the outline thus produced. These routine industrial operations do not give rise to any difficulty as long as the dimensions of the objects to be delimited are greater than the definition limits of the lithogravure process. The same is not the case when, for a special application of the electronic component, such as for use at high frequency, the emitter must be given very reduced dimensions. In the production of an emitter of minimum area by the conventional method of manufacture illustrated in FIGS. 1*a* and 1*b*, there is taken as the limit the definition of the photolithogravure process itself; that is, it is possible, in accordance with the drawing of FIG. 1*b*, to reduce the diameter *d* to the definition of the photolithogravure process itself. If the minimum width of the window which it is possible to open by photolithogravure is 2 microns, for example, the width or the diameter of the emitter may reach 2 microns in the conventional process.

In the process according to the aforesaid application, if photolithogravure is employed to uncover the zone 23 (FIG. 2*b*) for contact-making on the emitter, the limitation of the photolithogravure process is added to that which results from the imperfect centering of the position of the emitter. Therefore, the zone 23 must remain entirely within the contour of the level of the emitter-base junction, which must remain protected by the oxide. This makes it necessary to provide an emitter surface whose minimum dimensions correspond to the sum of these two limiting factors. Referring again to the aforesaid example (minimum width of a window equal to 2 microns), if it is necessary to provide for a centering error of 2 microns, for example, the width or diameter of the emitter will have to be at least 6 microns.

SUMMARY OF THE INVENTION

In order to obviate this difficulty, the present invention relates to a method of manufacturing semiconductor components having a number of zones of different types of conductivity, and especially components of this type wherein one face is to undergo successive treatments in regions in which the relative positions must be precisely defined.

In accordance with the present invention, an insulating layer is applied to said face and, by application of a first lithogravure process, whose selectivity is ensured by the use of a mask, windows are formed in the insulating layer which expose the face in the surface region or regions to which the first of the treatments is to be applied. Thereafter these treatments are applied, and the lithogravure process and the treatments are then repeated as many times as necessary in the appropriate regions, characterized in that, prior to the first lithogravure operation, a preliminary lithogravure operation is performed whereby the layer is recessed in the regions in which the windows are subsequently to be formed.

Such a procedure makes it possible to retain throughout the stages of manufacture the precision of the lithogravure process itself for the delimitation of the relative positions of the regions to be treated, despite the very small dimensions of the regions.

In addition, the present invention relates to a method of manufacturing semiconductor components having a number of zones of different types of conductivity as defined above, which method especially is applicable to the manufacture of semiconductor components wherein one of the aforesaid zones, herein called the base, completely separates another one of these zones, herein called the emitter, from the remainder of the semiconductor body constituting the component.

More generally, the present invention relates to a method of manufacturing semiconductor components having a number of zones of alternate types of conductivity, wherein one of the zones of such a component is obtained by appropriate introduction of impurities into the semiconductor body constituting the component from a portion of its surface which is bounded by a window in an insulating layer covering the remainder of the surface, the method being distinguished notably in that the surface portion consists of two regions which are not contiguous but are sufficiently close together so that, due to the lateral diffusion of these impurities accompanying their introduction from these two regions, the two partial zones resulting from this introduction are joined under the layer.

The present invention also relates to the semiconductor components produced by the method of the present invention.

DETAILED DESCRIPTION OF THE INVENTION

The method for producing these base and emitter zones consists of introducing "base" and "emitter" impurities into the semiconductor body from appropriate regions of the face of the body, each of these regions being defined, during the respective introductions, by a window in the insulating layer on the face of the body which is provided for this purpose and which covers the face, the window employed for producing the emitter here being called the "emitter window." In this method, "base" impurities are again introduced through the emitter region after the production of the latter, a permanent electric base contact being established between the base region and a connecting element. A permanent electric emitter contact is also established, after the production of the two zones, between the emitter region and a connecting element.

The method is also characterized in that a part of the base region, herein called the peripheral base (i.e., that part of the base region which is obtained through the emitter region, herein called the active base), is obtained by the introduction of impurities from one of the regions, herein called the peripheral region, which is distinct from the region from which the emitter is introduced but sufficiently close for the lateral diffusion effect to join the active and peripheral bases within the semiconductor body during the introduction steps, the active base being obtained and the emitter contact then being established through the emitter window without the edges of the window having been displaced, and the base contact being established on the peripheral region.

This method may also be distinguished by the fact that the impurities introduced from the aforesaid peripheral region are introduced before the formation of the central portion of the aforesaid base.

An example of the application of the present invention will be described hereinbelow, purely by way of illustration and without any limiting character, with reference to the accompanying diagrammatic FIGS. 3 to 9.

Like elements in these figures are denoted by the same references.

These figures are sectional views of a semiconductor device in the successive stages of its manufacture.

Figure 1A:
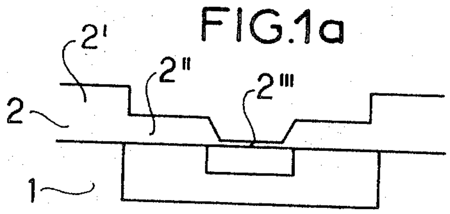
FIGS. 1*a* and 1*b* show a transistor being produced by a conventional method.
Figure 1B:
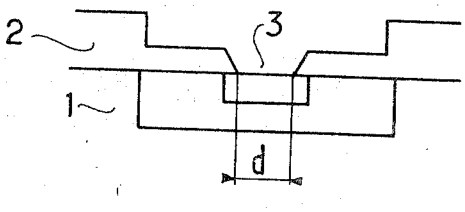
Figure 2A:
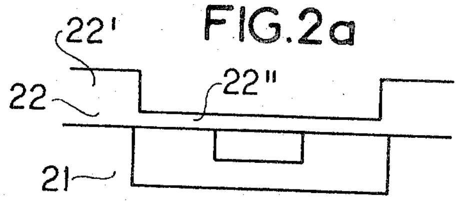
FIGS. 2*a* and 2*b* show a transistor being produced by the method described in French Pat. application No. pz 142,847 by the present inventors.
Figure 2B:
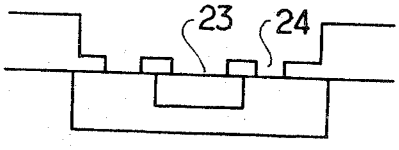
Figure 3:
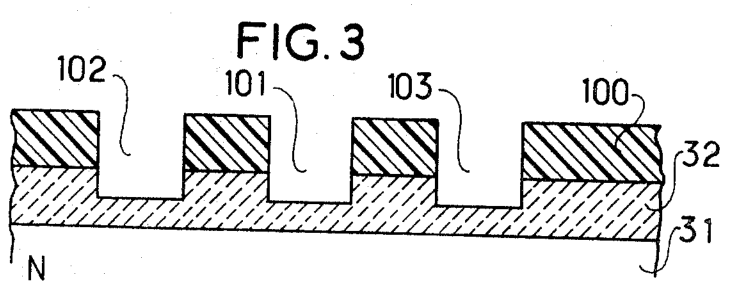
FIG. 3 shows a semiconductor component produced according to the present invention after the initial masking and the subsequent etching of the useful insulating layer.

In FIG. 3, which shows the semiconductor component after the initial masking and the subsequent etching of the useful insulating layer, there will be seen at 100 the initial mask consisting of a photosensitive lacquer having three apertures 101, 102 and 103 therein, aperture 101 corresponding to the emitter window and the other two apertures 102 and 103 corresponding to the two parts of the peripheral window. There is shown at 32 the insulating layer which is partially etched below the apertures 101, 102 and 103, that is, the emitter and peripheral windows are only partially apertured through this layer. However, they are delimited from the outset, whereby any subsequent inaccuracy in their relative positions, when they are completely apertured for the purpose of corresponding diffusions, will be avoided.

Figure 4:
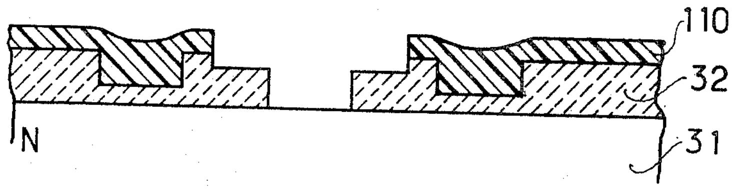
FIG. 4 illustrates a semiconductor component after a second masking.

FIG. 4 illustrates the semiconductor component after a second masking followed by a second etching. A mask 110 covers the peripheral base window and leaves free the emitter window, which is completely apertured by the second etching of the insulating layer 32. This second etching has, in addition, reduced the thickness of this layer in the neighborhood of the emitter window, in that part of the insulating layer which is not covered by the mask 110. The positioning of the mask need not be geometrically precise.

Figure 5:
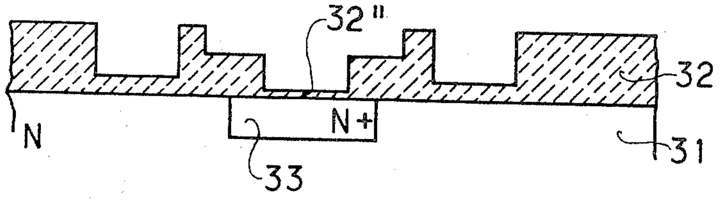
FIG. 5 shows a semiconductor component after an emitter has been diffused therein.

The diffusion for the production of the emitter is then carried out through the emitter window. This diffusion produces a thin layer of oxide 32'' at the base of the emitter window as illustrated in FIG. 5. In this figure, the mask 110 is not shown, because it has been eliminated after this diffusion. The emitter is shown at 33. It is obtained by the diffusion of an N-type impurity, such as phosphorus, into the semiconductor body 31, the body 31 of the semiconductor component also being of N-type, but less strongly doped.

Figure 6:
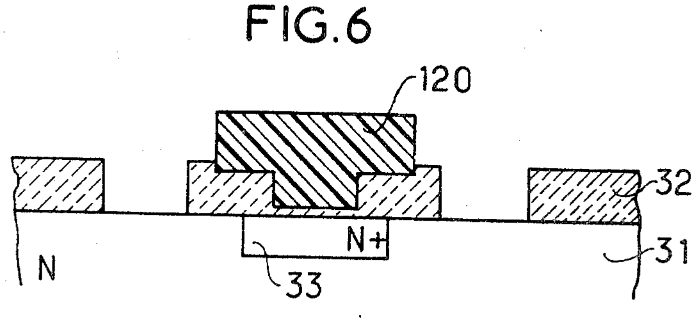
FIG. 6 illustrates a semiconductor component after a third masking and a third etching.
Figure 7:
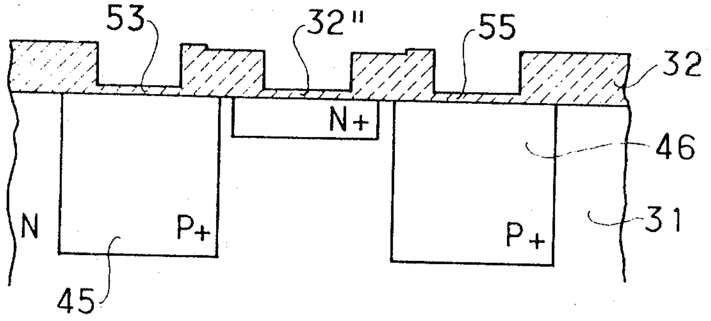
FIG. 7 illustrates a semiconductor component after a diffusion to form a peripheral base.

FIG. 6 illustrates the semiconductor component after a third masking and a third etching. A mask 120, of the same nature as the masks 100 and 110, has been disposed on the emitter window and in the neighborhood thereof without any high geometrical precision being necessary. The etching which has followed this masking has completed the opening of the peripheral window and has reduced the thickness of the layer in the neighborhood of the latter where it is not covered by the mask 120. The peripheral base is then produced by diffusion of a P-type impurity such as boron for 2 hours at 1100° C. in order to produce a zone of high surface concentration ($P^+$) at least equal to $10^{20}$ atom/cm.$^3$, which is intended to ensure high electrical conductivity. This peripheral base is composed of two parts 45 and 46 which may be seen in FIG. 7. The latter also shows the thin oxide layers 53 and 55 which are created at the base of the peripheral window during the production of the peripheral base.

The mask 120 is not shown here, because it has been eliminated after the production of the peripheral base.

Figure 8:
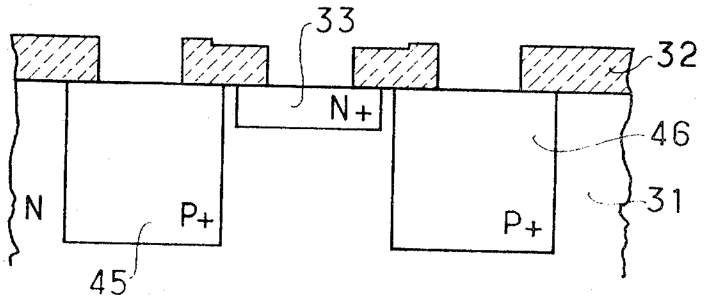
FIG. 8 illustrates a semiconductor component after a fourth etching.
Figure 9:
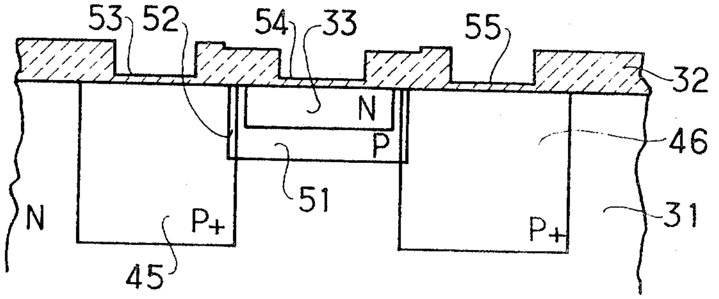
FIG. 9 illustrates a semiconductor component after a third diffusion operation.

Fig. 8 illustrates the semiconductor component after a fourth etching intended to eliminate the parasitic layer 32'' at the base of the emitter window. This elimination immediately precedes the third diffusing operation, which results in the formation of an active base 51, the final surface concentration of which is about $10^{19}$ atom/cm.$^3$ and is thus well below that of the peripheral region, which zone surrounds the emitter 33 and reaches, by lateral diffusion, the peripheral base 45,46. A zone common to these two bases is shown at 52 in FIG. 9.

It is then sufficient, for exposing the emitter and base connection regions, to perform a single washing operation which eliminates the oxide layers 53, 54, 55 without removing the layer 32, which is thicker.

The technical advantage afforded by the application of this method is very important, since it is possible to produce an emitter in which the lower limit of the surface dimension is determined by the limit definition of the lithogravure process, exactly as in the case of the conventional process, while at the same time it is possible thereby to make the base as fine as desired by controlling the duration of the diffusion of the second impurity.

The electrical continuity between the central portion of the base (active base) and the peripheral base 45, 46 (FIGS. 4, 5 and 6) is ensured by virtue of the fact that the materials laterally diffused from these two base zones meet one another.

This meeting can be brought about without any special difficulties, because on the one hand the lateral diffusion from the contact zones 45 and 46 may be adjusted in extension and may be developed to a predetermined extent in the semiconductor material, because the penetration of the impurity is not limited in depth. Thus, in the chosen example, a diffusion treatment for 2 hours at 1100° C. affords a lateral progress of the diffusion of about 2 microns. The lateral extension may be readily adjusted by the choice of the temperature and the duration of the treatment. On the other hand, this lateral extension need not terminate in the interior of the base zone 51, but it may reach the emitter 33. The only restriction which would result from the joining of the zones 45 and 46 with the emitter 33 would be a reduction of the base-emitter breakdown voltage, and this would not involve any serious limitation for many applications.

The application of the present invention to a method of making a planar NPN silicon transistor as described in the foregoing is not intended to be limited in nature. The method of the present invention is also applicable to any other semiconductor component having two, three or more layers, whether alternate or not, and notably wherever it is desirable to ensure the electrical continuity with connecting zones distinct from the active zone, the electrical connection of which they are to effect, or when it is desirable to retain the outline of a narrow aperture already employed for a diffusion when this same aperture is to be employed for a subsequent diffusion, the necessary surface extension of which normally requires a wider aperture.

What is claimed is:

1. A method of manufacturing a semiconductor component said method comprising:
   a. forming an insulating layer of silicon dioxide on a semiconductor body;
   b. selectively masking said insulating layer with a first mask of a lacquer and etching said insulating layer to produce in said insulating layer an emitter recess and a peripheral recess;
   c. removing said first mask, masking said peripheral recess with a second mask and etching said insulating layer to transform said emitter recess into an emitter window;
   d. diffusing an impurity through said emitter window to form an emitter;
   e. removing said second mask, masking said emitter window with a third mask and etching said insulating layer to transform said peripheral recess into a peripheral window;
   f. diffusing an impurity through said peripheral window to form a peripheral base;
   g. removing said third mask and etching said insulating layer to reopen said emitter window;
   h. diffusing an impurity into said body through said emitter window to form an active base which has a surface concentration less than that of said peripheral base, said active base surrounding said emitter and by lateral diffusion reaching said peripheral base; and
   i. etching said insulating layer to reopen said emitter and peripheral windows to make emitter and base electrical connections through the windows.

* * * * *